(12) United States Patent
Hahn et al.

(10) Patent No.: US 9,823,313 B2
(45) Date of Patent: Nov. 21, 2017

(54) DIAMOND NITROGEN VACANCY SENSOR WITH CIRCUITRY ON DIAMOND

(71) Applicant: Lockheed Martin Corporation, Bethesda, MD (US)

(72) Inventors: Joseph W. Hahn, Erial, NJ (US); Duc Huynh, Princeton Junction, NJ (US); Wilbur Lew, Mount Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/003,634

(22) Filed: Jan. 21, 2016

(65) Prior Publication Data

US 2017/0212182 A1 Jul. 27, 2017

(51) Int. Cl.
*G01R 33/032* (2006.01)
*G01R 33/00* (2006.01)

(52) U.S. Cl.
CPC ....... *G01R 33/032* (2013.01); *G01R 33/0052* (2013.01)

(58) Field of Classification Search
CPC combination set(s) only.
See application file for complete search history.

(56) References Cited

U.S. PATENT DOCUMENTS

| | | | |
|---|---|---|---|
| 2,746,027 A | 5/1956 | Murray | |
| 3,359,812 A | 12/1967 | Everitt | |
| 3,389,333 A | 6/1968 | Wolff et al. | |
| 3,490,032 A | 1/1970 | Zurflueh | |
| 3,514,723 A | 5/1970 | Cutler | |
| 3,518,531 A | 6/1970 | Huggett | |
| 3,745,452 A | 7/1973 | Osburn et al. | |
| 3,899,758 A | 8/1975 | Maier et al. | |
| 4,025,873 A | 5/1977 | Chilluffo | |
| 4,078,247 A | 3/1978 | Albrecht | |
| 4,084,215 A | 4/1978 | Willenbrock | |
| 4,322,769 A | 3/1982 | Cooper | |
| 4,329,173 A | 5/1982 | Culling | |
| 4,359,673 A | 11/1982 | Bross et al. | |
| 4,368,430 A | 1/1983 | Dale et al. | |
| 4,410,926 A | 10/1983 | Hafner et al. | |

(Continued)

FOREIGN PATENT DOCUMENTS

| | | |
|---|---|---|
| CN | 105738845 A | 7/2016 |
| DE | 69608006 T2 | 2/2001 |

(Continued)

OTHER PUBLICATIONS

Fallah et al., "Multi-sensor approach in vessel magnetic wake imaging," Wave Motion 51(1): 60-76 (Jan. 2014), retrieved from http://www.sciencedirect.com/science/article/pii/S0165200113 (Aug. 21, 2016), 17 pages.

(Continued)

*Primary Examiner* — Clayton E Laballe
*Assistant Examiner* — Jas Sanghera
(74) *Attorney, Agent, or Firm* — Foley & Lardner LLP

(57) ABSTRACT

A magnetic sensor assembly includes a base substrate and a material assembly. The material assembly is formed on the base substrate. The material assembly includes an assembly substrate. A magneto-optical defect center material having a plurality of magneto-optical defect centers is formed on the assembly substrate. A radio frequency (RF) excitation source is formed on the magneto-optical defect center material.

44 Claims, 7 Drawing Sheets

(56) References Cited

U.S. PATENT DOCUMENTS

| | | |
|---|---|---|
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,907,420 A | 5/1999 | Chraplyvy et al. |
| 5,907,907 A | 6/1999 | Ohtomo et al. |
| 6,042,249 A | 3/2000 | Spangenberg |
| 6,057,684 A | 5/2000 | Murakami et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,472,651 B1 | 10/2002 | Ukai |
| 6,472,869 B1 | 10/2002 | Upschulte et al. |
| 6,504,365 B2 | 1/2003 | Kitamura |
| 6,542,242 B1 | 4/2003 | Yost et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| RE40,343 E | 5/2008 | Anderson |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,805,030 B2 | 9/2010 | Bratkovski et al. |
| 7,916,489 B2 | 3/2011 | Okuya |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,138,756 B2 | 3/2012 | Barclay et al. |
| 8,193,808 B2 | 6/2012 | Fu et al. |
| 8,294,306 B2 | 10/2012 | Kumar et al. |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,758,509 B2 | 6/2014 | Twitchen et al. |
| 8,803,513 B2 | 8/2014 | Hosek et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,291,508 B1 | 3/2016 | Biedermann et al. |
| 9,369,182 B2 | 6/2016 | Kurs et al. |
| 9,570,793 B2 | 2/2017 | Borodulin |
| 9,614,589 B1 | 4/2017 | Russo et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0266050 A1 | 10/2008 | Crouse et al. |
| 2008/0299904 A1 | 12/2008 | Yi et al. |

(56) References Cited

U.S. PATENT DOCUMENTS

| | | |
|---|---|---|
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0195244 A1 | 8/2009 | Mouget et al. |
| 2009/0222208 A1 | 9/2009 | Speck |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0277121 A1 | 11/2010 | Hall et al. |
| 2010/0308813 A1 | 12/2010 | Lukin et al. |
| 2010/0315079 A1 | 12/2010 | Lukin et al. |
| 2010/0326042 A1 | 12/2010 | McLean et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0063957 A1 | 3/2011 | Isshiki et al. |
| 2011/0066379 A1 | 3/2011 | Mes |
| 2011/0120890 A1 | 5/2011 | Macpherson et al. |
| 2011/0127999 A1 | 6/2011 | Lott et al. |
| 2011/0165862 A1 | 7/2011 | Yu et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0093424 A1 | 4/2013 | Blank et al. |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2014/0012505 A1 | 1/2014 | Smith |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0210473 A1 | 7/2014 | Campbell et al. |
| 2014/0215985 A1 | 8/2014 | Pollklas |
| 2014/0247094 A1 | 9/2014 | Englund et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0031339 A1 | 2/2016 | Geo |
| 2016/0036529 A1 | 2/2016 | Griffith et al. |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0139048 A1 | 5/2016 | Heidmann |
| 2016/0146904 A1 | 5/2016 | Stetson et al. |
| 2016/0161429 A1 | 6/2016 | Englund et al. |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0266220 A1 | 9/2016 | Sushkov et al. |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010338 A1 | 1/2017 | Bayat et al. |
| 2017/0104426 A1 | 4/2017 | Mills |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |

(56) References Cited

U.S. PATENT DOCUMENTS

| | | |
|---|---|---|
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |

FOREIGN PATENT DOCUMENTS

| | | |
|---|---|---|
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2423366 A | 8/2008 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/158383 A1 | 10/2015 |
| WO | WO-2015/193156 A1 | 12/2015 |
| WO | WO-2016/075226 A1 | 5/2016 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

International Preliminary Report on Patentability dated Oct. 20, 2016 from related PCT application PCT/US2015/024723, 7 pages.

International Search Report and Written Opinion of the International Searching Authority dated Sep. 13, 2016 from related PCT application PCT/US16/14377, 11 pages.

Notice of Allowance dated Aug. 17, 2016, from related U.S. Appl. No. 15/003,718, 8 pages.

Notice of Allowance dated Sep. 8, 2016, from related U.S. Appl. No. 15/003,298, 10 pages.

Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.

Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.

U.S. Office Action dated Aug. 24, 2016 from related U.S. Appl. No. 14/676,740, 19 pages.

U.S. Office Action dated Oct. 14, 2016 from related U.S. Appl. No. 15/003,677, 13 pages.

U.S. Office Action dated Oct. 19, 2016 from related U.S. Appl. No. 15/218,821, 6 pages.

U.S. Office Action dated Nov. 2, 2016 from related U.S. Appl. No. 15/003,256, 19 pages.

U.S. Office Action dated Nov. 3, 2016 from related U.S. Appl. No. 15/204,675, 9 pages.

Widmann et al., "Coherent control of single spins in silicon carbide at room temperature," Nature Materials, 14: 164-168 (Feb. 2015) (available online Dec. 1, 2014), 5 pages.

Acosta et al., "Broadband magnetometry by infrared-absorption detection of nitrogen-vacancy ensembles in diamond," Appl. Phys. Letters 97: 174104 (Oct. 29, 2010), 4 pages.

Barry et al., "Optical magnetic detection of single-neuron action potentials using quantum defects in diamond," as submitted to Quantum Physics on Feb. 2, 2016, 23 pages.

Constable, "Geomagnetic Spectrum, Temporal." In Encyclopedia of Geomagnetism and Paleomagnetism, pp. 353-355, Springer: Dordrecht, Netherlands (2007).

International Search Report and Written Opinion of the International Searching Authority dated Apr. 1, 2016 from related PCT application PCT/US2016/014384, 12 pages.

International Search Report and Written Opinion of the International Searching Authority dated Apr. 11, 2016 from related PCT application PCT/US2016/014376, 12 pages.

International Search Report and Written Opinion of the International Searching Authority dated Apr. 11, 2016 from related PCT application PCT/US2016/014388, 14 pages.

(56) References Cited

OTHER PUBLICATIONS

International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016 from related PCT application PCT/US2016/014363, 8 pages.
International Search Report and Written Opinion of the International Searching Authority dated Mar. 25, 2016 from related PCT application PCT/US2016/014389, 19 pages.
International Search Report and Written Opinion of the International Searching Authority dated Mar. 28, 2016 from related PCT application PCT/US2016/014380, 9 pages.
International Search Report and Written Opinion of the International Searching Authority dated Mar. 28, 2016 from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016 from related PCT application PCT/US2016/014328, 7 pages.
International Search Report and Written Opinion of the International Searching Authority dated Mar. 29, 2016 from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).
Macquarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
U.S. Notice of Allowance dated Apr. 20, 2016, from related U.S. Appl. No. 15/003,718, 9 pages.
U.S. Notice of Allowance dated Mar. 29, 2016, from related U.S. Appl. No. 15/003,590, 11 pages.
U.S. Office Action dated Jul. 29, 2016 from related U.S. Appl. No. 14/680,877, 8 pages.
U.S. Office Action dated May 13, 2016, from related U.S. Appl. No. 14/676,740, 15 pages.
U.S. Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (U.S. Appl. No. 09/249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen-vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.

(56) References Cited

OTHER PUBLICATIONS

Anthony, et al., "Jahn-Teller Splitting and Zeeman Effect of Acceptors in Diamond," 20th International Conference on Defects in Semiconductors, Jul. 1999.

Appel, et al., "Nanoscale microwave imaging with a single electron spin in diamond," New Journal of Physics, Nov. 2015.

Arai, et al., "Fourier magnetic imaging with nanoscale resolution and compressed sensing speed-up using electronic spins in diamond," Nature Nanotechnology, Oct. 2015.

Aslam, et al., "Single spin optically detected magnetic resonance with 60-90 GHz (E-band) microwave resonators," Review of Scientific Instruments, Jun. 2015.

Awschalom, et al., "Diamond age of spintronics," Scientific American, Oct. 2007.

Babamoradi, et al., "Correlation between entanglement and spin density in nitrogen-vacancy center of diamond," European Physical Journal D, Dec. 2011.

Babunts, et al., "Diagnostics of NV defect structure orientation in diamond using optically detected magnetic resonance with a modulated magnetic field," Technical Physics Letters, Jun. 2015.

Babunts, et al., "Temperature-scanned magnetic resonance and the evidence of two-way transfer of a nitrogen nuclear spin hyperfine interaction in coupled NV—N pairs in diamond," JETP Letters, Jun. 2012.

Bagguley, et al., "Zeeman effect of acceptor states in semiconducting diamond," Journal of the Physical Society of Japan, 1966.

Balasubramanian, et al., "Nanoscale imaging magnetometry with diamond spins under ambient conditions," Nature, Oct. 2008.

Balmer, et al., "Chemical Vapour deposition synthetic diamond: materials technology and applications," J. of Physics, 2009.

Baranov, et al., "Enormously High Concentrations of Fluorescent Nitrogen-Vacancy Centers Fabricated by Sintering of Detonation Nanodiamonds," Small, Jun. 2011.

Barfuss, et al., "Strong mechanical driving of a single electron spin," Nature Physics, Oct. 2015.

Bennett, et al., "CVD Diamond for High Power Laser Applications," Proceedings of SPIE, Jan. 2013.

Berman & Chernobrod, "Single-spin microscope with sub-nanoscale resolution based on optically detected magnetic resonance," Proceedings of SPIE, May 2010.

Berman, et al. "Measurement of single electron and nuclear spin states based on optically detected magnetic resonance," J. Physics: Conf. Series 38: 167-170 (2006).

Blakley, et al., "Room-temperature magnetic gradiometry with fiber-coupled nitrogen-vacancy centers in diamond," Optics Letters, Aug. 2015.

Bourgeois, et al., "Photoelectric detection of electron spin resonance of nitrogen-vacancy centres in diamond," Nature Communications, Oct. 2015.

Budker & Kimball, "Optical Magnetometry," Cambridge Press, 2013.

Budker & Romalis, "Optical Magnetometry," Nature Physics, 2007.

Casanova, et al., "Effect of magnetic field on phosphorus centre in diamond," Physica Status Solidi A, Jul. 2001.

Castelletto, et al., "Frontiers in diffraction unlimited optical methods for spin manipulation, magnetic field sensing and imaging using diamond nitrogen vacancy defects," Nanophotonics, 2012.

Chapman, et al., "Anomalous saturation effects due to optical spin depolarization in nitrogen-vacancy centers in diamond nanocrystals," Physical Review B, Jul. 2012.

Chen, et al., "Vector magnetic field sensing by a single nitrogen vacancy center in diamond," EPL, Mar. 2013.

Chernobrod, et al., "Improving the sensitivity of frequency modulation spectroscopy using nanomechanical cantilevers," Applied Physics Letters, 2004.

Chernobrod, et al., "Spin Microscope Based on Optically Detected Magnetic Resoncance," Journal of Applied Physics, 2005.

Childress, et al., "Coherent dynamics of coupled electron and nuclear spin qubits in diamond," Science, 2006.

Chipaux, et al., "Magnetic imaging with an ensemble of nitrogen vacancy-centers in diamond," European Physical Journal D, Jul. 2015.

Chipaux, et al., "Nitrogen vacancies (NV) centers in diamond for magnetic sensors and quantum sensing," Proceedings of SPIE, Jan. 2015.

Chipaux, et al., "Wide bandwidth instantaneous radio frequency spectrum analyzer based on nitrogen vacancy centers in diamond," Applied Physics Letters, Dec. 2015.

Clevenson, et al., "Broadband magnetometry and temperature sensing with a light-trapping diamond waveguide," Nature Physics, May 2015.

Cooper, et al., " Time-resolved magnetic sensing with electronic spins in diamond," Nature Communications, Jan. 2014.

Creedon, et al., "Strong coupling between P1 diamond impurity centers and a three-dimensional lumped photonic microwave cavity," Physical Review B, Apr. 2015.

Davies, "Current problems in diamond: towards a quantitative understanding," Physica B—Condensed Matter, Dec. 1999.

De Lange, et al., "Single-Spin Magnetometry with Multipulse Sensing Sequences," Physical Review Letters, Feb. 2011.

Degen, "Scanning magnetic field microscope with a diamond single-spin sensor ," Applied Physics Letters, 2008.

Delacroix, et al., "Design, manufacturing, and performance analysis of mid-infrared achromatic half-wave plates with diamond subwavelength gratings," Applied Optics, 2012.

Denatale, et al., "Fabrication and characterization of diamond moth eye antireflective surfaces on Ge," J. of Applied Physics, 1982.

Dobrovitski, et al., "Quantum Control over Single Spins in Diamond," Annual Review of Condensed Matter Physics vol. 4, 2013.

Doherty, et al., "The nitrogen-vacancy colour centre in diamond," Physics Reports, Jul. 2013.

Doherty, et al., "Theory of the ground-state spin of the NV-center in diamond," Physical Review B, May 2012.

Doi, et al., "Pure negatively charged state of the NV center in n-type diamond," Physical Review B, Feb. 2016.

Drake, et al., "Influence of magnetic field alignment and defect concentration on nitrogen-vacancy polarization in diamond," New Journal of Physics, Jan. 2016.

Dreau, et al., "Avoiding power broadening in optically detected magnetic resonance of single NV defects for enhanced dc magnetic field sensitivity," Physical Review B, Nov. 2011.

Dreau, et al., "High-resolution spectroscopy of single NV defects coupled with nearby C-13 nuclear spins in diamond," Physical Review B, Apr. 2012.

Dumeige, et al., "Magnetometry with nitrogen-vacancy ensembles in diamond based on infrared absorption in a doubly resonant optical cavity," Physical Review B, Apr. 2013.

Epstein, et al., "Anisotropic interactions of a single spin and dark-spin spectroscopy in diamond," Center for Spintronics and Quantum Computation, 2005.

Fedotov, et al., "High-resolution magnetic field imaging with a nitrogen-vacancy diamond sensor integrated with a photonic-crystal fiber," Optics Letters, Feb. 2016.

Fedotov, et al., "Photonic-crystal-fiber-coupled photoluminescence interrogation of nitrogen vacancies in diamond nanoparticles," Laser Physics Letters, Feb. 2012.

Feng & Wei, "A steady-state spectral method to fit microwave absorptions of NV centers in diamonds: application to sensitive magnetic field sensing," Measurement Science & Technology, Oct. 2014.

Freitas, et al., "Solid-State Nuclear Magnetic Resonance (NMR) Methods Applied to the Study of Carbon Materials," Chemistry and Physics of Carbon, vol. 31, 2012.

Geiselmann, et al., "Fast optical modulation of the fluorescence from a single nitrogen-vacancy centre," Nature Physics, Dec. 2013.

Gombert & Blasi, "The Moth-Eye Effect—From Fundamentals to Commercial Exploitation," Functional Properties of Bio-Inspired Surfaces, Nov. 2009.

Gong, et al., "Generation of Nitrogen-Vacancy Center Pairs in Bulk Diamond by Molecular Nitrogen Implantation," Chinese Physics Letters, Feb. 2016.

(56) References Cited

OTHER PUBLICATIONS

Gould, et al., "An imaging magnetometer for bio-sensing based on nitrogen-vacancy centers in diamond," Proceedings of the SPIE—Progress in Biomedical Optics and Imaging, 2014.

Gould, et al., "Room-temperature detection of a single 19 nm super-paramagnetic nanoparticle with an imaging magnetometer," Applied Physics Letters, Aug. 2014.

Gruber, et al., "Scanning confocal optical microscopy and magnetic resonance on single defect centers," Science, Jun. 1997.

Haeberle, et al., "Nanoscale nuclear magnetic imaging with chemical contrast," Nature Nanotechnology, Feb. 2015.

Haihua, et al., "Design of wideband anti-reflective sub wavelength nanostructures," Infrared and Laser Engineering, 2011.

Hall, et al., "Sensing of Fluctuating Nanoscale Magnetic Fields Using Nitrogen-Vacancy Centers in Diamond," Physical Review Letters, Nov. 2009.

Hanson, et al., "Coherent Dynamics of a single spin interacting with an adjustable spin bath," Sci. Am. Ass'n. for the Advancement of Science, 2008.

Hanson, et al., "Polarization and Readout of Coupled Single Spins in Diamond," Physical Review Letters, 2006.

Hanson, et al., "Room-temperature manipulation and decoherence of a single spin in diamond," Physical Review, 2006.

Hanzawa, et al., "Zeeman effect on the zero-phonon line of the NV center in synthetic diamond," Physica B, Feb. 1993.

Hegyi & Yablonovitch, "Molecular imaging by optically detected electron spin resonance of nitrogen-vacancies in nanodiamonds," Nano Letters, Mar. 2013.

Hegyi & Yablonovitch, "Nanodiamond molecular imaging with enhanced contrast and expanded field of view," Journal of Biomedical Optics, Jan. 2014.

Hilser, et al., "All-optical control of the spin state in the NV-center in diamond," Physical Review B, Sep. 2012.

Hobbs, "Study of the Environmental and Optical Durability of AR Microstructures in Sapphire, ALON, and Diamond," Proceedings of SPIE, 2009.

Huebener, et al., "ODMR of NV centers in nano-diamonds covered with N@C60," Physica Status Solidi B, Oct. 2008.

Huxter, et al., "Vibrational and electronic dynamics of nitrogen-vacancy centres in diamond revealed by two-dimensional ultrafast spectroscopy," Nature Physics, Nov. 2013.

Ivady, et al., "Pressure and temperature dependence of the zero-field splitting in the ground state of NV centers in diamond: A first-principles study," Physical Review B, Dec. 2014.

Jarmola, et al., "Temperature- and Magnetic-Field-Dependent Longitudinal Spin Relaxation in Nitrogen-Vacancy Ensembles in Diamond," Physical Review Letters, May 2012.

Jensen, et al., "Light narrowing of magnetic resonances in ensembles of nitrogen-vacancy centers in diamond," Physical Review, Jan. 2013.

Kailath, "Linear Systems," Prentice Hall, 1979.

Karlsson, et al., "Diamond micro-optics: microlenses and antireflection structures surfaces for the infrared spectral region," Optics Express, 2003.

Khan & Hemmer, "Noise limitation in nano-scale imaging," Proceedings of SPIE, Dec. 2005.

Kim, et al., "Electron spin resonance shift and linewidth broadening of nitrogen-vacancy centers in diamond as a function of electron irradiation dose," Applied Physics Letters, Aug. 2012.

Kim, et al., "Magnetospectroscopy of acceptors in 'blue' diamonds," Physica B, Aug. 2001.

Kim, et al., "Zeeman effect of electronic Raman lines of accepters in elemental semiconductors: Boron in blue diamond," Physical Review B, Sep. 2000.

King, et al., "Optical polarization of 13C nuclei in diamond through nitrogen vacancy centers," Physical Review B, Feb. 2010.

Kok, et al., "Materials Science: Qubits in the pink," Nature, 2006.

Konenko, et al., "Formation of antireflective surface structures on diamond films by laser patterning," Applied Physics A, 1999.

Kraus, et al., "Magnetic field and temperature sensing with atomic-scale spin defects in silicon carbide," Scientific Reports, Jul. 2014.

Lai, et al., "Influence of a static magnetic field on the photoluminescence of an ensemble of nitrogen-vacancy color centers in a diamond single-crystal," Applied Physics Letters, Sep. 2009.

Lai, et al., "Optically detected magnetic resonance of a single Nitrogen-Vacancy electronic spin in diamond nanocrystals," CLEO/EQEC, 2009.

Laraoui, et al., "Nitrogen-vacancy-assisted magnetometry of paramagnetic centers in an individual diamond nanocrystal," Nano Letters, Jul. 2012.

Lazariev, et al., "A nitrogen-vacancy spin based molecular structure microscope using multiplexed projection reconstruction," Scientific Reports, Sep. 2015.

Lee, et al., "Vector magnetometry based on $S=\frac{3}{2}$ electronic spins," Physical Review B, Sep. 2015.

Lesik, et al., "Preferential orientation of NV defects in CVD diamond films grown on (113)-oriented substrates," Diamond and Related Materials, Jun. 2015.

Levchenko, et al., "Inhomogeneous broadening of optically detected magnetic resonance of the ensembles of nitrogen-vacancy centers in diamond by interstitial carbon atoms," Applied Physics Letters, Mar. 2015.

Liu, et al., "Electron spin studies of nitrogen vacancy centers in nanodiamonds," Acta Physica Sinica, Aug. 2013.

Liu, et al., "Fiber-integrated diamond-based magnetometer," Applied Physics Letters, Sep. 2013.

MaClaurin, et al., "Nanoscale magnetometry through quantum control of nitrogen-vacancy centres in rotationally diffusing nanodiamonds," New Journal of Physics, Jan. 2013.

Macs, et al., "Diamond as a magnetic field calibration probe," Journal of Physics D: Applied Physics, Apr. 2004.

Maletinsky, et al., "A robust scanning diamond sensor for nanoscale imaging with single nitrogen-vacancy centres," Nature Nanotechnology, May 2012.

Mamin, et al., "Multipulse Double-Quantum Magnetometry with Near-Surface Nitrogen-Vacancy Centers," Physical Review Letters, Jul. 2014.

Mamin, et al., "Nanoscale Nuclear Magnetic Resonance with a Nitrogen-Vacancy Spin Sensor," Science, Feb. 2013.

Manson, et al., "GR transitions in diamond: magnetic field measurements," Journal of Physics C, Nov. 1980.

Massachusetts Institute of Technology; "Wide-Field Imaging Using Nitrogen Vacancies" in Patent Application Approval Process, Physics Week (2015).

Matsuda, et al., "Development of a plastic diamond anvil cell for high pressure magneto-photoluminescence in pulsed high magnetic fields," International Journal of Modern Physics B, Nov. 2004.

Maze et al., "Nanoscale magnetic sensing with an individual electronic spin in diamond," Nature Physics (2008).

Maze, et al., "Nanoscale magnetic sensing using spin qubits in diamond," Nature Physics, 2009.

Meijer, et al., "Generation of single color centers by focused nitrogen implantation," Applied Physics Letters, Dec. 2005.

Millot, et al., "High-field Zeeman and paschen-back effects at high pressure in oriented ruby," Physical Review B, Oct. 2008.

Moriyama, et al., "Importance of electron-electron interactions and Zeeman splitting in single-wall carbon nanotube quantum dots," Physica E, Feb. 2005.

Mrozek, et al., "Circularly polarized microwaves for magnetic resonance study in the GHz range: Application to nitrogen-vacancy in diamonds," Applied Physics Letters, Jul. 2015.

Nagl, et al., "Improving surface and defect center chemistry of fluorescent nanodiamonds for imaging purposes—a review," Analytical and Bioanalaytical Chemistry, Oct. 2015.

Neumann, et al., "Excited-state spectroscopy of single NV defects in diamond using optically detected magnetic resonance," New Journal of Physics, Jan. 2009.

Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.

(56) References Cited

OTHER PUBLICATIONS

Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H-(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-½nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(-)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Steinert et al., "High-sensitivity magnetic imaging using an array of spins in diamond," Rev. Sci. Inst. (2010).
Steinert et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
U.S. Appl. No. 14/659,498, filed Mar. 16, 2015.
U.S. Appl. No. 14/676,740, filed Apr. 1, 2015.
U.S. Appl. No. 15/003,678, filed Jan. 21, 2016.
U.S. Appl. No. 14/680,877, filed Apr. 7, 2015.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016.
U.S. Appl. No. 15/003,309, filed Jan. 21, 2016.
U.S. Appl. No. 15/003,176, filed Jan. 21, 2016.
U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016.

(56) References Cited

OTHER PUBLICATIONS

U.S. Appl. No. 15/003,519, filed Jan. 21, 2016.
U.S. Appl. No. 15/003,677, filed Jan. 21, 2016.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016.
U.S. Appl. No. 15/003,718, filed Jan. 21, 2016.
U.S. Appl. No. 15/003,062, filed Jan. 21, 2016.
U.S. Appl. No. 15/003,652, filed Jan. 21, 2016.
U.S. Appl. No. 15/003,634, filed Jan. 21, 2016.
U.S. Appl. No. 15/003,670, filed Jan. 21, 2016.
U.S. Appl. No. 15/003,088, filed Jan. 21, 2016.
U.S. Appl. No. 15/003,797, filed Jan. 21, 2016.
U.S. Appl. No. 15/003,590, filed Jan. 21, 2016.
U.S. Appl. No. 15/003,206, filed Jan. 21, 2016.
U.S. Appl. No. 15/003,193, filed Jan. 21, 2016.
U.S. Appl. No. 15/003,617, filed Jan. 21, 2016.
U.S. Appl. No. 15/003,396, filed Jan. 21, 2016.
U.S. Appl. No. 15/003,177, filed Jan. 21, 2016.
U.S. Appl. No. 15/003,209, filed Jan. 21, 2016.
U.S. Appl. No. 15/179,957, filed Jun. 10, 2016.
U.S. Appl. No. 15/207,457, filed Jul. 11, 2016.
U.S. Appl. No. 15/218,821, filed Jul. 25, 2016.
U.S. Appl. No. 15/204,675, filed Jul. 7, 2016.
U.S. Appl. No. 15/350,303, filed Nov. 14, 2016.
U.S. Appl. No. 15/351,862, filed Jul. 7, 2016.
U.S. Appl. No. 15/372,201, filed Dec. 7, 2016.
U.S. Appl. No. 15/376,244, filed Dec. 12, 2016.
U.S. Appl. No. 15/380,691, filed Dec. 15, 2016.
U.S. Appl. No. 15/382,045, filed Dec. 16, 2016.
U.S. Appl. No. 15/380,419, filed Dec. 15, 2016.
U.S. Appl. No. 15/419,832, filed Jan. 30, 2017.
U.S. Appl. No. 15/400,794, filed Jan. 6, 2017.
U.S. Appl. No. 15/443,422, filed Jan. 27, 2017.
U.S. Appl. No. 15/440,194, filed Feb. 23, 2017.
U.S. Appl. No. 15/437,222, filed Feb. 20, 2017.
U.S. Appl. No. 15/437,038, filed Feb. 20, 2017.
International Search Report and Written Opinion of the International Searching Authority in PCT/US2016/014390 dated Feb. 15, 2017.
Notice of Allowance dated Dec. 13, 2016, from related U.S. Appl. No. 14/680,877.
Notice of Allowance dated Dec. 22, 2016, from related U.S. Appl. No. 14/659,498.
U.S. Notice of Allowance dated Feb. 14, 2017, from related U.S. Appl. No. 15/003,677, 8 pages.
U.S. Office Action dated Feb. 10, 2017, from related U.S. Appl. No. 14/676,740, 38 pages.
U.S. Office Action dated Feb. 10, 2017, from related U.S. Appl. No. 15/003,088, 32 pages.
U.S. Office Action dated Feb. 16, 2017, from related U.S. Appl. No. 15/204,675, 15 pages.
GB Office Action dated Jan. 10, 2017, in related national stage application GB1618202.4.
Brenneis, et al. "Ultrafast electronic readout of diamond nitrogen-vacancy centres coupled to graphene." Nature nanotechnology 10.2 (2015): 135-139.
Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability." arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.
Heerema, et al. "Graphene nanodevices for DNA sequencing." Nature nanotechnology 11.2 (Feb. 3, 2016): 127-136.

International Search Report and Written Opinion of the International Searching Authority dated Apr. 4, 2017 from related PCT application PCT/US16/68366, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 6 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017, from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Moessle, et al. "SQUID-detected magnetic resonance imaging in microtesla fields." Annu. Rev. Biomed. Eng. 9 (May 23, 2008): 389-413.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Mar. 15, 2017, from related U.S. Appl. No. 15/351,862, 6 pages.
U.S. Notice of Allowance dated May 26, 2017 from related U.S. Appl. No. 15/218,821, 7 pages.
U.S. Office Action dated Apr. 17, 2017, from related U.S. Appl. No. 15/003,558, 12 pages.
U.S. Office Action dated Mar. 16, 2017, from related U.S. Appl. No. 15/218,821, 7 pages.
U.S. Office Action dated May 22, 2017, from related U.S. Appl. No. 15/003,206, 12 pages.
Wells, et al. "Assessing graphene nanopores for sequencing DNA." Nano letters 12.8 (Jul. 10, 2012): 4117-4123.

(56) References Cited

OTHER PUBLICATIONS

Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Michaelovich et al., "Polarization Dependencies of the Nitrogen-Vacancy Center." Undergraduate Project Report, Ben-Gurion University, Aug. 2015, pp. 1-9.
Notice of Allowance dated Jun. 8, 2017, from related U.S. Appl. No. 15/351,862, 7 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
U.S. Notice of Allowance dated Aug. 11, 2017 from related U.S. Appl. No. 15/003,558, 5 pages.
US Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
Wroble, "Performance Analysis of Magnetic Indoor Local Positioning System." Western Michigan University Master's Theses, Paper 609 (Jun. 2015), 42 pages.
International Search Report and Written Opinion from related PCT application PCT/US2017/035315 dated Aug. 24, 2017, 7 pages.
Ramsey, et al., "Phase Shifts in the Molecular Beam Method of Separated Oscillating Fields", Physical Review, vol. 84, No. 3, Nov. 1, 1951, pp. 506-507.
U.S. Notice of Allowance on U.S. Appl. No. 14/676,740 dated Sep. 1, 2017, 7 pages.
U.S. Notice of Allowance on U.S. Appl. No. 15/003,206 dated Sep. 18, 2017, 11 pages.
U.S. Notice of Allowance on U.S. Appl. No. 15/003,281 dated Sep. 26, 2017, 7 pages.
U.S. Notice of Allowance on U.S. Appl. No. 15/476,636 dated Sep. 14, 2017, 10 pages.
U.S. Office Action on U.S. Appl. No. 15/003,176 dated Sep. 27, 2017, 8 pages.
U.S. Office Action on U.S. Appl. No. 15/003,292 dated Sep. 8, 2017, 8 pages.

DIAMOND NITROGEN VACANCY SENSOR WITH CIRCUITRY ON DIAMOND

The disclosure generally relates to a sensor assembly of a magnetic sensor.

BACKGROUND

Magnetic sensors based on a nitrogen vacancy (NV) center in diamond are known. Diamond NV (DNV) sensors may provide good sensitivity for magnetic field measurements. Such magnetic sensor systems often include components such an an optical excitation source, an RF excitation source, and optical detectors. These components are all formed on different substrates or as separate components mechanically supported together.

SUMMARY

According to some embodiments, there may be provided a magnetic sensor assembly. The magnetic sensor assembly comprises: a base substrate; and a diamond assembly, formed on the base substrate, and comprising: an assembly substrate; nitrogen vacancy (NV) diamond material comprising a plurality of NV centers, and formed on the assembly substrate; and a radio frequency (RF) excitation source formed on the NV diamond material, wherein the RF excitation source has a spiral shape.

According to one aspect, the RF excitation source may comprise a first RF excitation source on a first side of the NV diamond material, and a second RF excitation source on a second side of the NV diamond material opposite to the first side.

According to another aspect, the RF excitation source may be formed on a first side the NV diamond material, and a size of the RF excitation source in a plane of the first side is greater than a size of the first side of the NV diamond material.

According to another aspect, the magnetic sensor assembly, may further comprise: an assembly substrate; and one or more optical detectors formed in a detector region in a plane on the assembly substrate, wherein a size of the RF excitation source in the plane is greater than a size of the detector region.

According to another aspect, the RF excitation source may be formed on a first side the NV diamond material, and a size of the RF excitation source in a plane of the first side is greater than a size of the first side of the NV diamond material.

According to another embodiment, there may be provided a magnetic sensor assembly. The magnetic sensor assembly comprises: a base substrate; and a diamond assembly, formed on the base substrate, and comprising: an assembly substrate; nitrogen vacancy (NV) diamond material comprising a plurality of NV centers, and formed on the assembly substrate; and a radio frequency (RF) excitation source formed on the NV diamond material.

According to one aspect, the RF excitation source may be in the form of a coil.

According to another aspect, the RF excitation source may comprises: a seed layer formed on a surface of the NV diamond material; and a film metallization layer formed on the seed layer.

According to another aspect, the film metallization layer may be formed of copper.

According to another aspect of the embodiment, the diamond assembly may further comprise an RF connector connected to the excitation source, the RF connector configured to connect to a power source and a controller.

According to another aspect, the base substrate may comprise a printed circuit board (PCB).

According to another embodiment, there may be provided magnetic sensor assembly. The magnetic sensor assembly comprises: a base substrate; and a material assembly, formed on the base substrate, and comprising: an assembly substrate; magneto-optical defect center material comprising a plurality of magneto-optical defect centers, and formed on the assembly substrate; and a radio frequency (RF) excitation source formed on the magneto-optical defect center material.

According to another embodiment, there may be provided a magnetic sensor assembly. The magnetic sensor assembly comprises: a base substrate; and
a diamond assembly, formed on the base substrate, and comprising: an assembly substrate; nitrogen vacancy (NV) diamond material comprising a plurality of NV centers, and formed on the assembly substrate; and an electromagnetic excitation source formed on the NV diamond material or on the assembly substrate; and power/logic circuits formed on the base substrate and electrically connected to the electromagnetic excitation source to provide control of the electromagnetic excitation source.

According to one aspect, electromagnetic excitation source may be an optical excitation source.

According to another aspect, the base substrate may comprises a printed circuit board (PCB).

According to another aspect, the magnetic sensor assembly may further comprise a power/logic connector electrically connected to the power/logic circuits and comprising a plurality of connectors configured to connect to an external power source and controller.

According to another aspect, at least some of the power/logic circuits may be mounted on a same top surface of the base substrate that the diamond assembly is mounted on.

According to another aspect, at least some of the power/logic circuits may be mounted on a bottom surface of the base substrate opposite to a surface of the base substrate that the diamond assembly is mounted on.

According to another embodiment, there may be provided a magnetic sensor assembly. The magnetic sensor assembly comprises: a base substrate; and a diamond assembly, formed on the base substrate, and comprising: an assembly substrate; nitrogen vacancy (NV) diamond material comprising a plurality of NV centers, and formed on the assembly substrate; and an optical excitation source formed on the NV diamond material.

According to one aspect, the optical excitation source may be one of a laser diode or a light emitting diode.

According to another embodiment, there may be provided a magnetic sensor assembly. The magnetic sensor assembly comprises: a base substrate; and a diamond assembly, formed on the base substrate, and comprising: an assembly substrate; nitrogen vacancy (NV) diamond material comprising a plurality of NV centers, and formed on the assembly substrate; and an optical detector formed on the assembly substrate.

According to another aspect, the optical detector may be a photodiode.

According to another aspect, the base substrate may comprise a printed circuit board (PCB).

According to another embodiment, there may be provided a magnetic sensor assembly. The magnetic sensor assembly comprises: a base substrate; and a diamond assembly, formed on the base substrate, and comprising: an assembly substrate; nitrogen vacancy (NV) diamond material comprising a plurality of NV centers, and formed on the assembly substrate; an optical excitation source formed on the assembly substrate; and an optical detector formed on the assembly substrate.

According to another aspect, the optical detector may be a photodiode.

According to another aspect, the optical excitation source may be one of a laser diode or a light emitting diode.

According to another embodiment, there may be provided a magnetic sensor assembly. The magnetic sensor assembly comprises: a base substrate; and a material assembly, formed on the base substrate, and comprising: an assembly substrate; magneto-optical defect center material comprising a plurality of magneto-optical defect centers, and formed on the assembly substrate; an optical excitation source formed on the assembly substrate; and an optical detector formed on the assembly substrate.

According to another embodiment, there may be provided a magnetic sensor assembly. The magnetic sensor assembly comprises: a base substrate; and a diamond assembly, formed on the base substrate, and comprising: an assembly substrate; nitrogen vacancy (NV) diamond material comprising a plurality of NV centers, and formed on the assembly substrate; a plurality of optical excitation sources formed on the assembly substrate; and a plurality of optical detectors formed on the assembly substrate.

According to another aspect, the optical excitation sources and the optical detectors may be arranged in an alternating fashion on the assembly substrate.

According to another aspect, the optical excitation sources and the optical detectors may be arranged in a checkerboard fashion.

According to another aspect, the optical excitation sources may be one of laser diodes or light emitting diodes.

According to another aspect, the optical detectors may be photodiodes.

According to another embodiment, there may be provided a magnetic sensor assembly. The magnetic sensor assembly comprises: a base substrate; and a diamond assembly, formed on the base substrate, and comprising: an assembly substrate; nitrogen vacancy (NV) diamond material comprising a plurality of NV centers, and formed on the assembly substrate; and a plurality of optical excitation sources formed on a top surface of the assembly substrate, wherein the assembly substrate has a plurality of connection pads on a bottom surface of the assembly substrate contacting corresponding conducting through connections extending through the assembly substrate and electrically connected to plurality of the optical excitation sources.

According to another aspect, the magnetic sensor assembly may further comprise a radio frequency (RF) excitation source formed on the NV diamond material.

According to another embodiment, there may be provided a method of forming a magnetic sensor assembly comprising: forming a base substrate; forming an assembly substrate on base substrate; forming a nitrogen vacancy (NV) diamond material comprising a plurality of NV centers on the assembly substrate; and forming a radio frequency (RF) excitation source on the NV diamond material.

According to another aspect, the forming a RF excitation source may form the RF excitation source in the form of a coil.

According to another aspect, the forming a RF excitation source may comprise: forming a seed layer on a surface of the NV diamond material; depositing a film metallization layer formed on the seed layer; and patterning the seed layer and the film metallization to form the RF excitation source in a spiral shape.

According to another aspect, the film metallization layer may be formed of copper.

According to another embodiment, there may be provided a method of forming a magnetic sensor assembly comprising: forming a base substrate; forming an assembly substrate on base substrate; forming a plurality of optical excitation sources on the assembly substrate; and forming a nitrogen vacancy (NV) diamond material comprising a plurality of NV centers on the assembly substrate.

According to another embodiment, there may be provided magnetic sensor assembly, comprising: a base substrate; and a material assembly, formed on the base substrate, and comprising: an assembly substrate; magneto-optical defect center material comprising a plurality of magneto-optical defect centers, and formed on the assembly substrate; and a radio frequency (RF) means, for providing an RF field, formed on the magneto-optical defect center material.

According to another embodiment, there may be provided a magnetic sensor assembly, comprising: a base substrate; and a material assembly, formed on the base substrate, and comprising: an assembly substrate; magneto-optical defect center material comprising a plurality of magneto-optical defect centers, and formed on the assembly substrate; an optical excitation means, for providing optical excitation, formed on the assembly substrate; and a detector means, for detecting optical radiation, formed on the assembly substrate.

DETAILED DESCRIPTION

Figure 1:
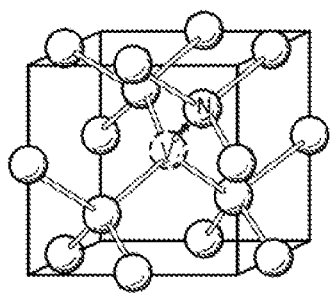
FIG. 1 illustrates one orientation of a NV center in a diamond lattice.

The present inventors have realized that the DNV magnetic sensors with a sensor assembly described herein provides a number of advantages over magnetic sensor systems where the optical excitation sources, RF excitation source, and optical detectors are all formed on different substrates or as separate components mechanically supported. The sensor assembly described provides for a diamond NV sensor system in a single compact homogeneous device. Providing the optical excitation sources and the optical detectors on the same assembly substrate, such as on a same silicon wafer, reduces the overall system cost, size and weight. Providing the RF excitation source directly on the NV diamond material reduces the overall system size and weight. Providing the optical detectors directly on the NV diamond material reduces the amount of the red fluorescence emitted by the NV centers lost to the surroundings, which improves the system efficiency. Providing the optical excitation sources directly on the NV diamond material increases the amount of the optical excitation light by drastically reducing the amount of optical excitation light lost to the environment. Combining the optical excitation sources, RF excitation source, and optical detectors directly on the NV diamond material results in a significant size reduction that results in NV diamond sensors that are usable in small consumer and industrial products NV Center, its Electronic Structure, and Optical and RF Interaction The nitrogen vacancy (NV) center in diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. Conventionally, the neutral charge state uses the nomenclature $NV^0$, while the negative charge state uses the nomenclature NV, which is adopted in this description.

The NV center has a number of electrons including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
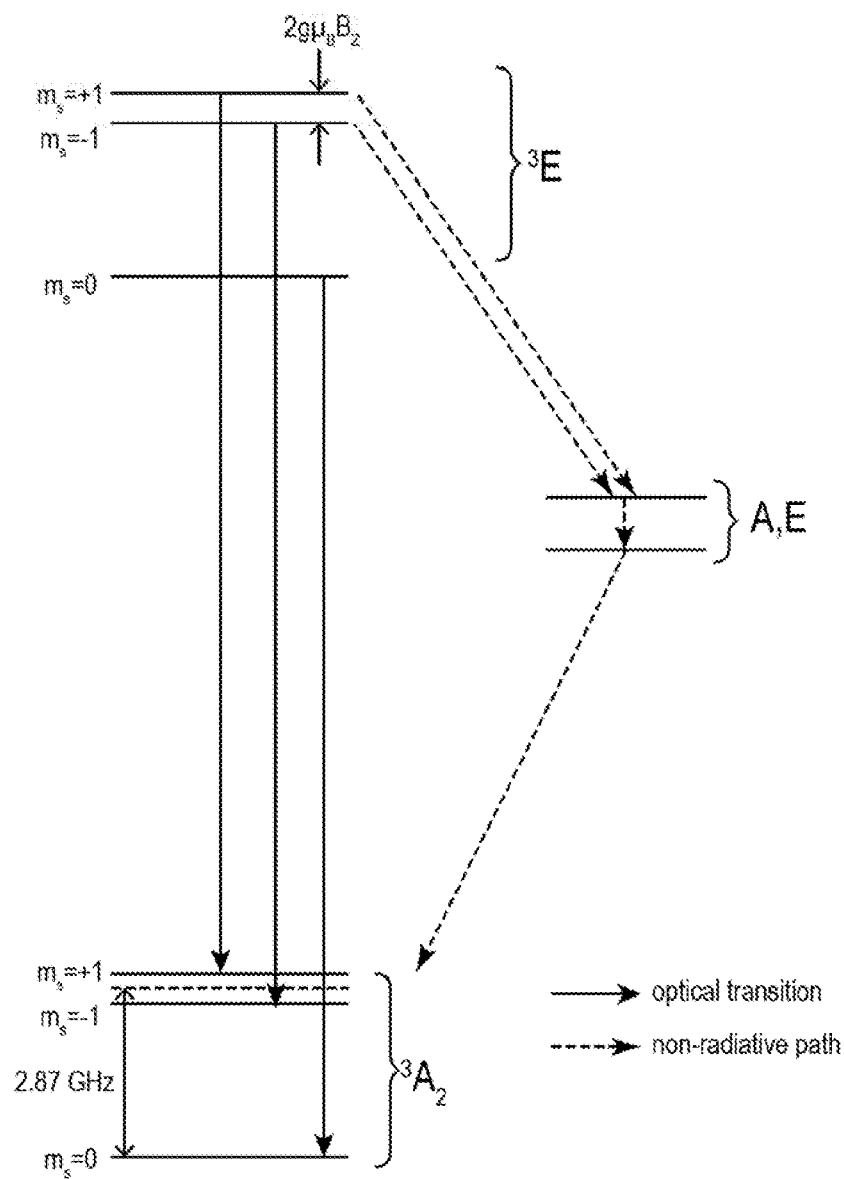
FIG. 2 is an energy level diagram illustrates energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm1$ energy levels are offset from the $m_s=0$ due to spin-spin interactions, and the $m_s=\pm1$ energy levels are degenerate, i.e., they have the same energy. The $m_s=0$ spin state energy level is split from the $m_s=\pm1$ energy levels by an energy of 2.87 GHz for a zero external magnetic field.

Introducing an external magnetic field with a component along the NV axis lifts the degeneracy of the $m_s=\pm1$ energy levels, splitting the energy levels $m_s=\pm1$ by an amount $2g\mu_B Bz$, where g is the g-factor, $\mu_B$ is the Bohr magneton, and Bz is the component of the external magnetic field along the NV axis. This relationship is correct for a first order and inclusion of higher order corrections is a straight forward matter and will not affect the computational and logic steps in the systems and methods described below.

The NV center electronic structure further includes an excited triplet state $^3E$ with corresponding $m_s=0$ and $m_s=\pm1$ spin states. The optical transitions between the ground state $^3A_2$ and the excited triplet $^3E$ are predominantly spin conserving, meaning that the optical transitions are between initial and final states which have the same spin. For a direct transition between the excited triplet $^3E$ and the ground state $^3A_2$, a photon of red light is emitted with a photon energy corresponding to the energy difference between the energy levels of the transitions.

There is, however, an alternate non-radiative decay route from the triplet $^3E$ to the ground state $^3A_2$ via intermediate electron states, which are thought to be intermediate singlet states A, E with intermediate energy levels. Significantly, the transition rate from the $m_s=\pm1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm1$ spin states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm1$ states than for the $m_s=0$ spin state. This is so because the decay via the intermediate states does not result in a photon emitted in the fluorescence band, and because of the greater probability that the $m_s=\pm1$ states of the excited triplet $^3E$ state will decay via the non-radiative decay path. The lower fluorescence intensity for the $m_s=\pm1$ states than for the $m_s=0$ spin state allows the fluorescence intensity to be used to determine the spin state. As the population of the $m_s=\pm1$ states increases relative to the $m_s=0$ spin, the overall fluorescence intensity will be reduced.

NV Center, or Magneto-Optical Defect Center, Magnetic Sensor System

Figure 3:
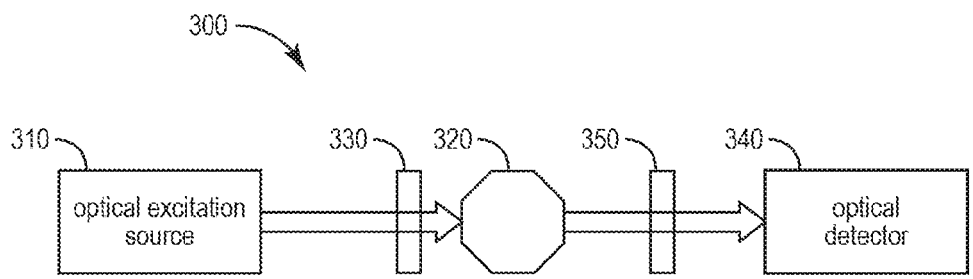
FIG. 3 is a schematic illustrating a NV center magnetic sensor system.

FIG. 3 is a schematic illustrating a NV center magnetic sensor system 300 which uses fluorescence intensity to distinguish the $m_s=\pm1$ states, and to measure the magnetic field based on the energy difference between the $m_s=+1$ state and the $m_s=-1$ state. The system 300 includes an optical excitation source 310, which directs optical excitation to an NV diamond material 320 with NV centers. The system 300 further includes an RF excitation source 330 which provides RF radiation to the NV diamond material 320. Light from the NV diamond may be directed through an optical filter 350 to an optical detector 340.

The RF excitation source 330 may be a microwave coil, for example. The RF excitation source 330 when emitting RF radiation with a photon energy resonant with the transition energy between ground $m_s=0$ spin state and the $m_s=+1$ spin state excites a transition between those spin states. For such a resonance, the spin state cycles between ground $m_s=0$ spin state and the $m_s=+1$ spin state, reducing the population in the $m_s=0$ spin state and reducing the overall fluorescence at resonance. Similarly resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state. At resonance between the $m_s=0$ spin state and the $m_s=-1$ spin state, or between the $m_s=0$ spin state and the $m_s=+1$ spin state, there is a decrease in the fluorescence intensity.

The optical excitation source 310 may be a laser or a light emitting diode, for example, which emits light in the green, for example. The optical excitation source 310 induces fluorescence in the red, which corresponds to an electronic transition from the excited state to the ground state. Light from the NV diamond material 320 is directed through the optical filter 350 to filter out light in the excitation band (in the green for example), and to pass light in the red fluorescence band, which in turn is detected by the detector 340. The optical excitation light source 310, in addition to exciting fluorescence in the diamond material 320, also serves to reset the population of the $m_s=0$ spin state of the ground state $^3A_2$ to a maximum polarization, or other desired polarization.

Figure 4:
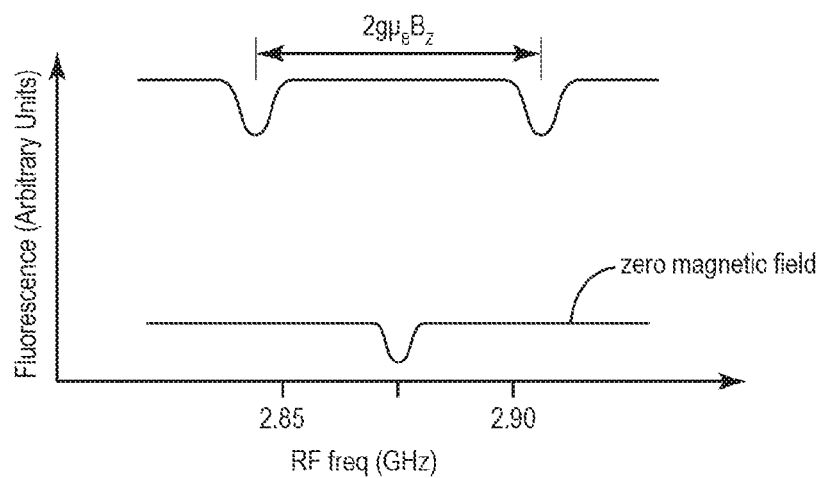
FIG. 4 is a graph illustrating the fluorescence as a function of applied RF frequency of an NV center along a given direction for a zero magnetic field and a non-zero magnetic field.

For continuous wave excitation, the optical excitation source 310 continuously pumps the NV centers, and the RF excitation source 330 sweeps across a frequency range which includes the zero splitting (when the $m_s=\pm1$ spin states have the same energy) photon energy of 2.87 GHz. The fluorescence for an RF sweep corresponding to a diamond material 320 with NV centers aligned along a single direction is shown in FIG. 4 for different magnetic field components Bz along the NV axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples, of pulsed excitation schemes include Ramsey pulse sequence, and spin echo pulse sequence.

Figure 5:
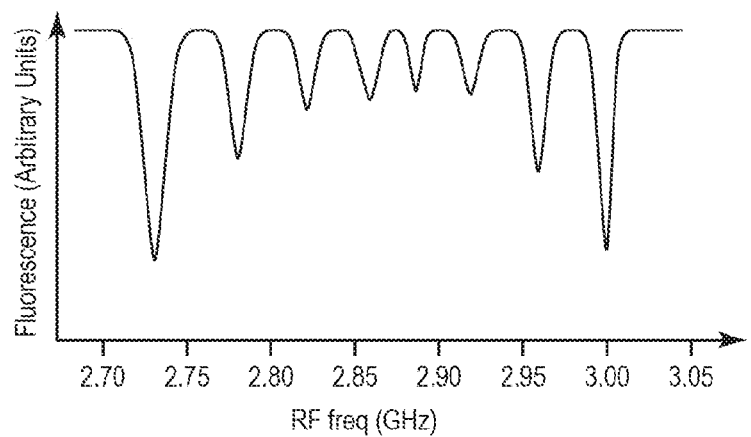
FIG. 5 is a graph illustrating the fluorescence as a function of applied RF frequency for four different NV center orientations for a non-zero magnetic field.

In general, the diamond material 320 will have NV centers aligned along directions of four different orientation classes. FIG. 5 illustrates fluorescence as a function of RF frequency for the case where the diamond material 320 has NV centers aligned along directions of four different orientation classes. In this case, the component Bz along each of the different orientations may be determined. These results along with the known orientation of crystallographic planes of a diamond lattice allows not only the magnitude of the external magnetic field to be determined, but also the direction of the magnetic field.

While FIG. 3 illustrates an NV center magnetic sensor system 300 with NV diamond material 320 with a plurality of NV centers, in general the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
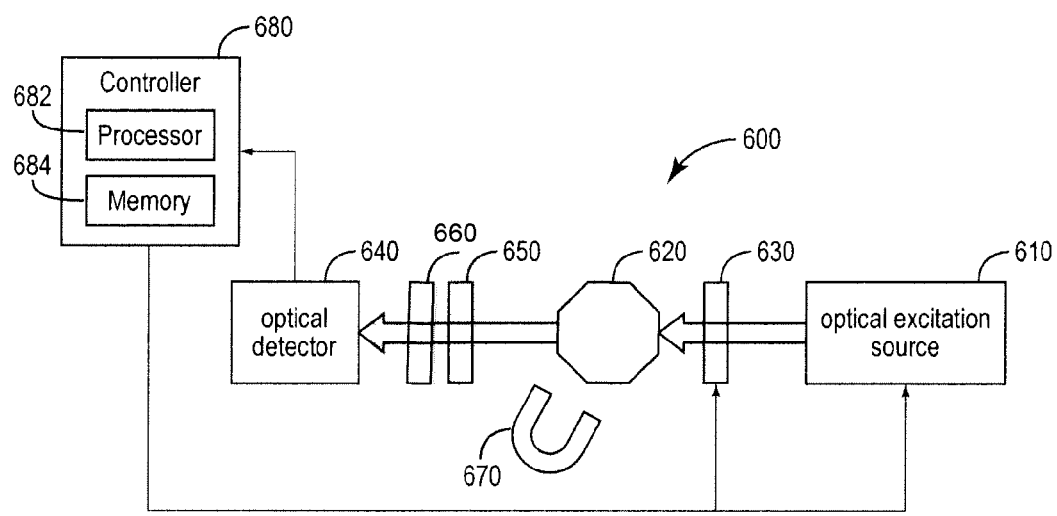
FIG. 6 is a schematic illustrating a NV center magnetic sensor system according to an embodiment of the invention.

FIG. 6 is a schematic of an NV center magnetic sensor 600, according to an embodiment of the invention. The sensor 600 includes an optical excitation source 610, which directs optical excitation to an NV diamond material 620 with NV centers, or another magneto-optical defect center material with magneto-optical defect centers. An RF excitation source 630 provides RF radiation to the NV diamond material 620. The NV center magnetic sensor 600 may include a bias magnet 670 applying a bias magnetic field to the NV diamond material 620. Light from the NV diamond material 620 may be directed through an optical filter 650 and an electromagnetic interference (EMI) filter 660, which suppresses conducted interference to an optical detector 640. The sensor 600 further includes a controller 680 arranged to receive a light detection signal from the optical detector 640 and to control the optical excitation source 610 and the RF excitation source 630.

The RF excitation source 630 may be a microwave coil, for example. The RF excitation source 630 is controlled to emit RF radiation with a photon energy resonant with the transition energy between the ground $m_s=0$ spin state and the $m_s=\pm1$ spin states as discussed above with respect to FIG. 3.

The optical excitation source 610 may be a laser or a light emitting diode, for example, which emits light in the green, for example. The optical excitation source 610 induces fluorescence in the red, which corresponds to an electronic transition from the excited state to the ground state. Light from the NV diamond material 620 is directed through the optical filter 650 to filter out light in the excitation band (in the green for example), and to pass light in the red fluorescence band, which in turn is detected by the optical detector 640. The EMI filter 660 is arranged between the optical filter 650 and the optical detector 640 and suppresses conducted interference. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610 and the RF excitation source 630. The controller may include a processor 682 and a memory 684, in order to control the operation of the optical excitation source 610 and the RF excitation source 630. The memory 684, which may include a nontransitory computer readable medium, may store instructions to allow the operation of the optical excitation source 610 and the RF excitation source 630 to be controlled.

According to one embodiment of operation, the controller 680 controls the operation such that the optical excitation source 610 continuously pumps the NV centers of the NV diamond material 620. The RF excitation source 630 is controlled to continuously sweep across a frequency range which includes the zero splitting (when the $m_s=\pm1$ spin states have the same energy) photon energy of 2.87 GHz. When the photon energy of the RF radiation emitted by the RF excitation source 630 is the difference in energies of the $m_s=0$ spin state and the $m_s=-1$ or $m_s=+1$ spin state, the overall fluorescence intensity is reduced at resonance, as discussed above with respect to FIG. 3. In this case, there is a decrease in the fluorescence intensity when the RF energy resonates with an energy difference of the $m_s=0$ spin state and the $m_s=-1$ or $m_s=+1$ spin states. In this way the component of the magnetic field Bz along the NV axis may be determined by the difference in energies between the $m_s=-1$ and the $m_s=+1$ spin states.

As noted above, the diamond material 620 will have NV centers aligned along directions of four different orientation classes, and the component Bz along each of the different orientations may be determined based on the difference in energy between the $m_s=-1$ and the $m_s=+1$ spin states for the respective orientation classes. In certain cases, however, it may be difficult to determine which energy splitting corresponds to which orientation class, due to overlap of the energies, etc. The bias magnet 670 provides a magnetic field, which is preferably uniform on the NV diamond material 620, to separate the energies for the different orientation classes, so that they may be more easily identified.

Figure 7A:
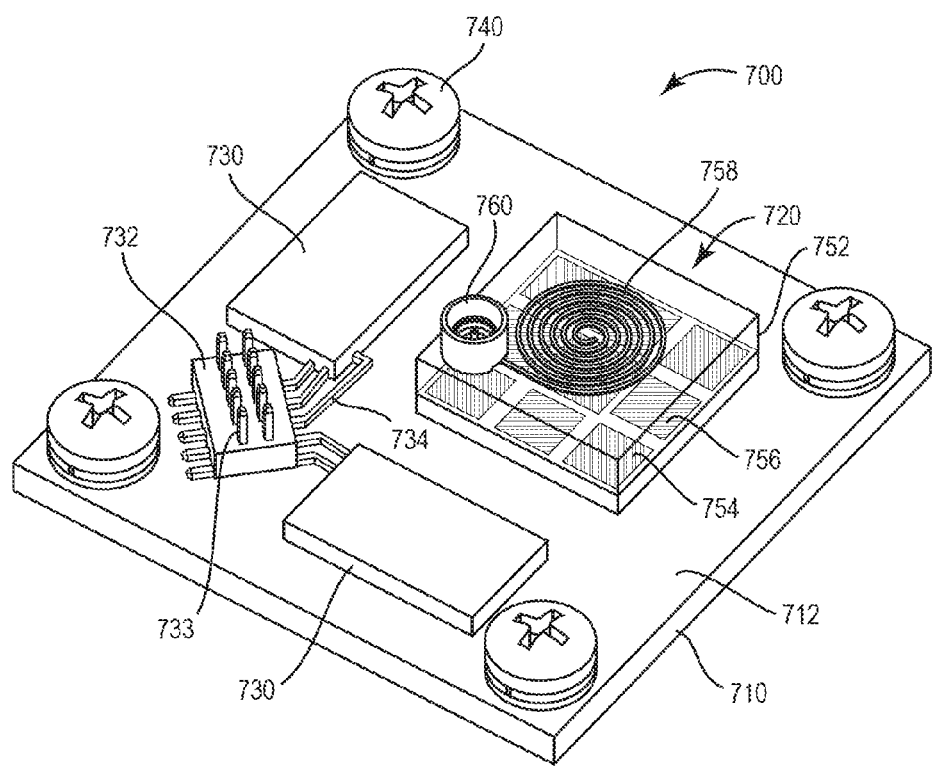
FIG. 7A is a top perspective view of a sensor assembly according to an embodiment of the invention.
Figure 7B:
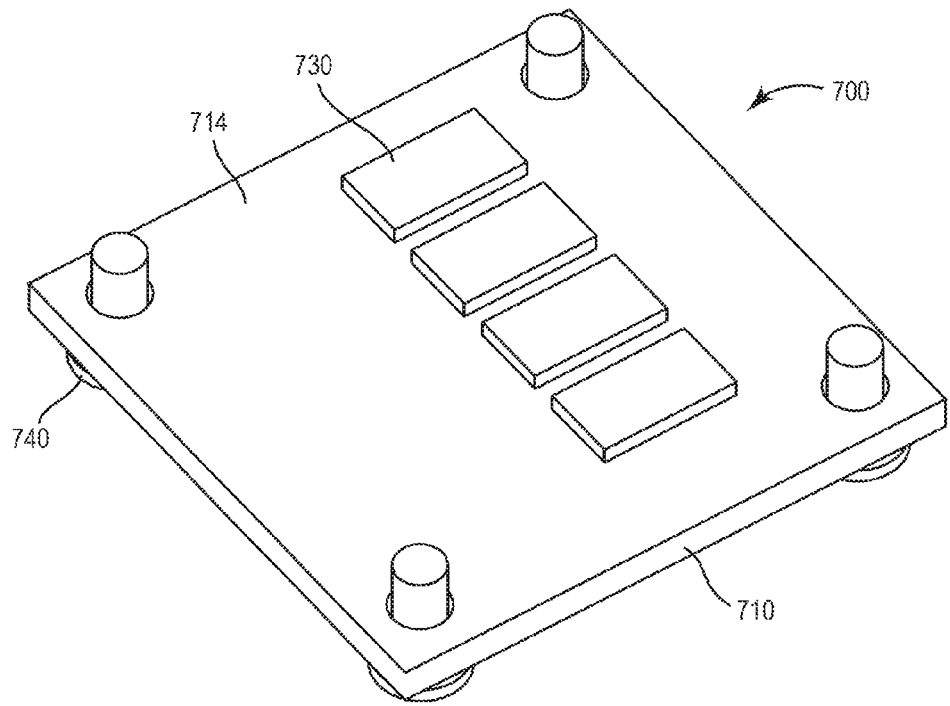
FIG. 7B is a bottom perspective view of the sensor assembly of FIG. 7A.
Figure 8A:
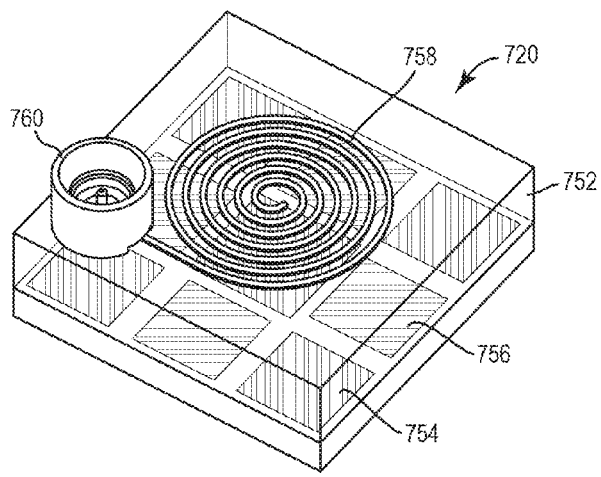
FIG. 8A is a top perspective view of a diamond assembly of the sensor assembly of FIG. 7A.
Figure 8B:
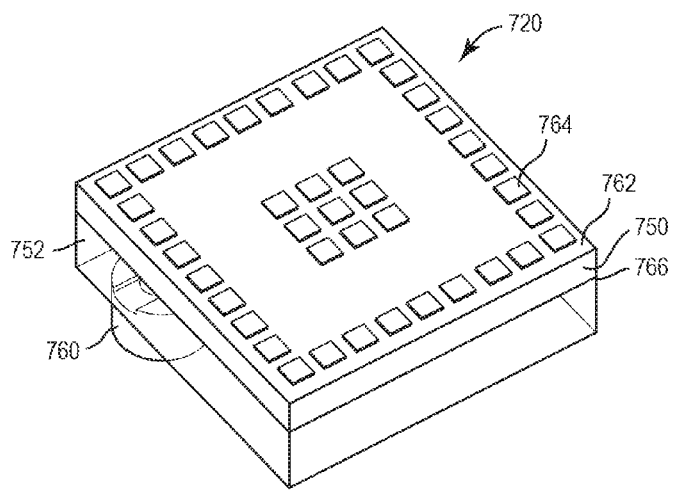
FIG. 8B is a bottom perspective view of the diamond assembly of FIG. 8A.
Figure 8C:
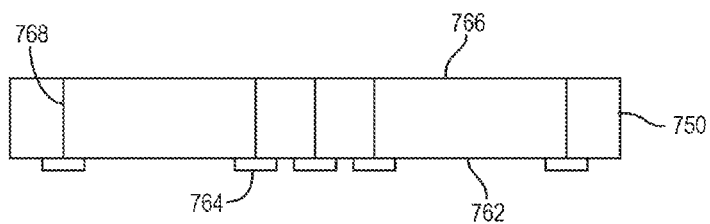
FIG. 8C is a side view of an assembly substrate of the sensor assembly of FIG. 8A.
Figure 9:
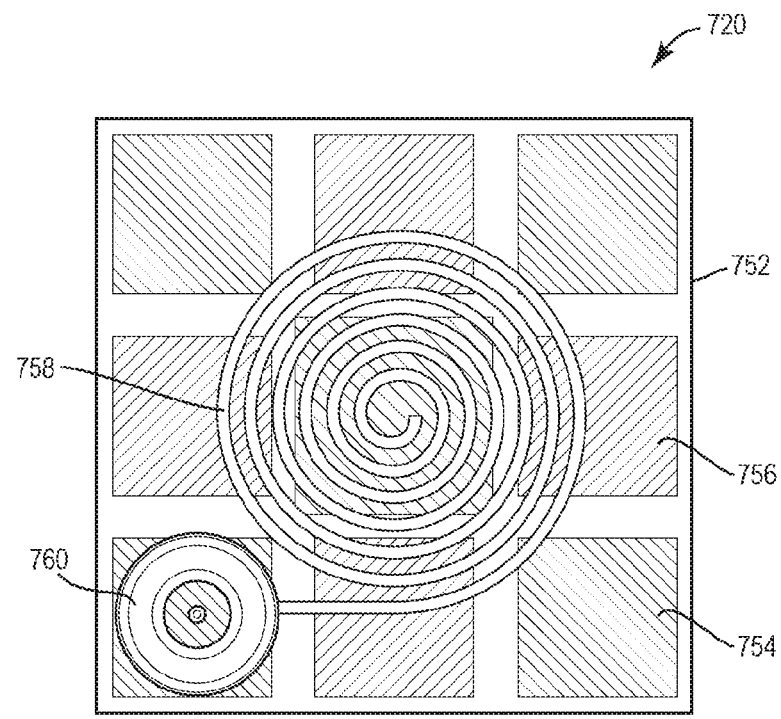
FIG. 9 is a top view of the diamond assembly of FIG. 8A.

A sensor assembly 700, which includes a base substrate 710 and a diamond assembly 720, or a material assembly generally, of a NV center magnetic sensor according to an embodiment, is illustrated in FIGS. 7A, 7B, 8A, 8B, 8C and 9. FIGS. 7A and 7B respectively illustrates a top perspective view, and a bottom perspective view of the sensor assembly 700. FIGS. 8A and 8B respectively illustrate a top perspective view, and a bottom perspective view of the diamond assembly 720. FIG. 8C illustrates a side view of an assembly substrate 750 of the diamond assembly 720. FIG. 9 illustrates a top view of the diamond assembly 720.

The sensor assembly 700 includes a base substrate 710, and a diamond assembly 720 arranged on the base substrate 710. The sensor assembly 700 further includes power/logic circuits 730, which may be in the form of chips, mounted on the base substrate 710, both on a top surface 712 adjacent the diamond assembly 720, and on bottom surface 714 opposite to the top surface 712. Attachment elements 740, such as screws for example, extending in the base substrate 710, allow for the attachment of the sensor assembly 700 to further components. The base substrate 710 may be, for example, a printed circuit board (PCB).

The diamond assembly 720 has the assembly substrate 750, and NV diamond material 752, or another magneto-optical defect center material with magneto-optical defect centers, formed over the assembly substrate 750. As best seen in FIGS. 8A and 9, the diamond assembly 720 includes a plurality of optical excitation sources 754 and a plurality of optical detectors 756 on, or embedded in, the assembly substrate 750. An RF excitation source 758 is formed on the NV diamond material 752, and connected to an RF connector 760. The optical excitation sources 754 and the RF excitation source 758 are in general terms electromagnetic excitation sources.

As seen in FIGS. 7A, 8A and 9, the optical excitation sources 754 and the optical detectors 756 may be arranged in an alternating fashion, such as the checkerboard arrangement shown. While FIGS. 7A, 8A and 9 illustrate an arrangement with four optical excitation sources 754 and five optical detectors 756, other numbers of optical excitation sources 754 and optical detectors 756 are contemplated. The alternating arrangement of the optical excitation sources 754 and the optical detectors 756 reduces the amount of the red fluorescence emitted by the NV diamond material 752 lost to the surroundings, which improves the system efficiency The optical excitation sources 754 and the optical detectors 756 need not be arranged in an alternating fashion.

As seen in FIGS. 8B and 8C, a bottom surface 762 of the assembly substrate 750, opposite to a top surface 766 adjacent the NV diamond material 752, has a plurality of connection pads 764. Conductive through connections 768 electrically connect the connection pads 764 to the top surface 766, and electrically connect to the optical excitation sources 754 and the plurality of optical detectors 756 to allow control of the optical excitation sources 754 and to receive optical signals from the plurality of optical detectors 756. The power/logic circuits 730 are electrically connected to the connection pads 764 via wirings 734 on the base substrate 710, to allow control of the optical excitation sources 754 and to receive optical signals from the plurality of optical detectors 756. In the case the power/logic circuits 730 are mounted on the bottom surface 714 of the base substrate 710, the wirings 734 may extend through the base substrate 710 to those power/logic circuits 730.

A power/logic connector 732 is electrically connected to the power/logic circuits 730. The power/logic connector 732 includes a plurality of connectors 733, which allow for connection of power/logic circuits 730 to a power source and controller (not shown in FIGS. 7A-9) external to the sensor assembly 700, such as the controller 680 illustrated in FIG. 6. The control functions may be split between the power logic circuits 730 and the external controller. Similarly, the RF connector 760 allows for connection of the RF excitation source 758 to a power source and controller (not shown in FIGS. 7A-9) outside the sensor assembly 700, such as the controller 680 illustrated in FIG. 6.

The assembly substrate 750 may be a semiconductor material, such as silicon, upon which the plurality of optical excitation sources 754 and a plurality of optical detectors 756 are formed. The assembly substrate 750 may be a silicon wafer, for example. The optical excitation sources 754 may be laser diodes or light emitting diodes (LEDs), for example. The optical excitation sources 754 emit light which excites fluorescence in the NV diamond material 752, and may emit in the green, such at a wavelength of about 532 nm or 518 nm, for example. Preferably, the excitation light is not in the red so as to not interfere with the red fluorescent light collected and detected. The optical detectors 756 detect light, and in particular detect light in the red fluorescence band of the NV diamond material 752. The optical excitation sources 754 and the optical detectors 756 may be formed on a single silicon wafer as the assembly substrate 750 using fabrication techniques known for silicon fabrication, such as doping, ion implantation, and patterning techniques.

The power/logic circuits 730 and the power/logic connecter 732 are mounted on the base substrate 710, which may be a PCB. The mounting may be performed by soldering, for example. Once the optical excitation sources 754 and the optical detectors 756 are formed on the assembly substrate 750, the NV diamond material 752 is attached with the assembly substrate 750.

The RF excitation source 758 may be formed on the NV diamond material 752 in the form of a coil as seen in FIG. 8A, for example. The RF excitation source 758 acts as a microwave RF antenna. The RF excitation source 758 may be formed by forming a metal material on the NV diamond material 752 followed by patterning the metal material. The metal material may be patterned by photolithography techniques, for example.

Figure 10A:
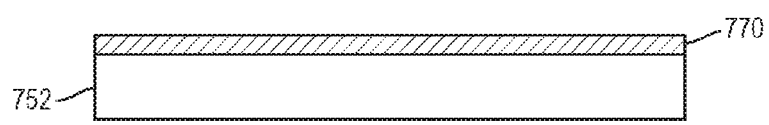
FIGS. 10A and 10B are side views of diamond material with metal layers illustrating steps of forming a RF excitation source according to an embodiment.
Figure 10B:
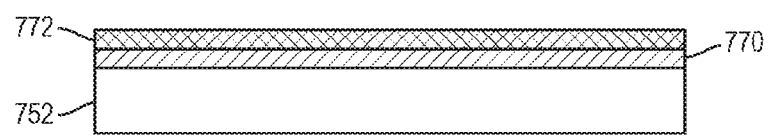

As shown in FIGS. 10A and 10B, the metal material may be formed on the NV diamond material 752 first by forming a thin film seed layer 770 on the NV diamond material 752, followed by depositing a film metallization 772 on the seed layer 770. The seed layer 770 may be, for example, TiW, and the film metallization 772 may be Cu, for example. Once the seed layer 770 and the film metallization 772 are formed, they are patterned, such as by photolithography techniques, for example, to form the RF excitation source 758 into a coil shape. The RF connector 760 is then formed at one end of the coil shaped RF excitation source 758.

The sensor assembly described herein provides a number of advantages over magnetic sensor systems where the optical excitation sources, RF excitation source, and optical detectors are all formed on different substrates or as separate components mechanically supported. The sensor assembly described provides for a diamond NV sensor system in a single compact homogeneous device. Providing the optical excitation sources and the optical detectors on the same assembly substrate, such as on a same silicon wafer, reduces the overall system cost, size and weight. Providing the RF excitation source directly on the NV diamond material reduces the overall system size and weight. Providing the optical detectors directly on the NV diamond material reduces the amount of the red fluorescence emitted by the NV centers lost to the surroundings, which improves the system efficiency. Providing the optical excitation sources directly on the NV diamond material increases the amount of the optical excitation light by drastically reducing the amount of optical excitation light lost to the environment. Combining the optical excitation sources, RF excitation source, and optical detectors directly on the NV diamond material results in a significant size reduction that results in NV diamond sensors that are usable in small consumer and industrial products.

Figure 11A:
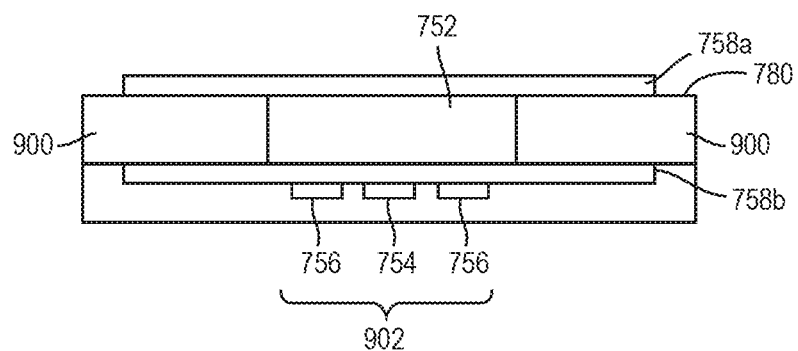
FIG. 11A is a top view of the diamond assembly according to another embodiment.
Figure 11B:
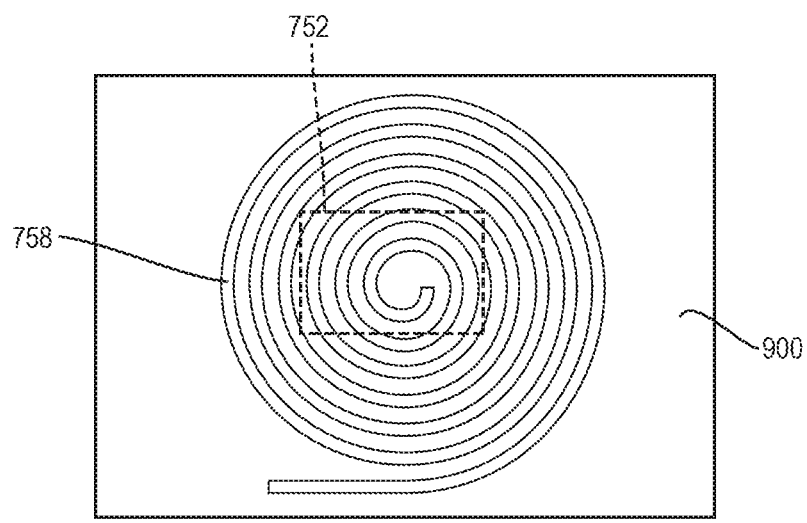
FIG. 11B is a side view of the diamond assembly if FIG. 11A.

FIGS. 11A and 11B illustrate a diamond assembly according to another embodiment. In this embodiment the RF excitation source 758, which may comprise a first RF excitation source 758a and second RF excitation source 758b, is larger in the plane of the NV diamond material 752 than the NV diamond material 752. The first RF excitation source 758a and the second RF excitation source 758b are on opposite sides of the NV diamond material 752. The plane of the NV diamond material 752 is horizontal and into the page in FIG. 11A, and is parallel to the page in FIG. 11B. While FIGS. 11A and 11B illustrate two RF excitation source 758a and 758b, only a single RF excitation source may be provided. The diamond assembly of FIGS. 11A and 11B further may include optical detectors 756 and optical excitation sources 754 in a similar fashion to earlier disclosed embodiments.

The shape of first RF excitation source 758a and second RF excitation source 758a may be spiral as shown in FIG. 11A (as well as in FIGS. 7A, 8A and 9). The spiral shape provides a maximum field with low driving power, thus providing good efficiency. Moreover, the spiral shape allows for the coil of the RF excitation source to be made larger, which allows for a more uniform field over a larger device.

The size of the first RF excitation source 758a and second RF excitation source 758a in the plane of the top surface 780 of the NV diamond material 752 is greater than a size of the top surface 780 in the plane. The greater size allows for a more uniform field provided by the RF excitation sources 758a and 758b applied to the NV diamond material 752. In this regard, the RF excitation sources 758a and 758b are on the NV diamond material 752, but further extend to a support material 900 laterally adjacent the NV diamond material 752. The support material may be a material other than diamond, or may be diamond substantially without NV centers, for example. The size of the first RF excitation source 758a and second RF excitation source 758a in the plane of the top surface 780 of the NV diamond material 752 is also greater than a size of a detector region 902 which includes the optical detectors 756.

The embodiments of the inventive concepts disclosed herein have been described in detail with particular reference to preferred embodiments thereof, but it will be understood by those skilled in the art that variations and modifications can be effected within the spirit and scope of the inventive concepts.

What is claimed is:

1. A magnetic sensor assembly, comprising:
   a base substrate; and
   a diamond assembly, formed on the base substrate, and comprising:
     an assembly substrate;
     nitrogen vacancy (NV) diamond material comprising a plurality of NV centers, and formed on the assembly substrate; and
     a radio frequency (RF) excitation source formed on the NV diamond material, wherein the RF excitation source has a spiral shape.

2. The magnetic sensor assembly of claim 1, wherein the RF excitation source comprises a first RF excitation source on a first side of the NV diamond material, and a second RF excitation source on a second side of the NV diamond material opposite to the first side.

3. The magnetic sensor assembly of claim 1, wherein RF excitation source is formed on a first side of the NV diamond material, and a size of the RF excitation source in a plane of the first side is greater than a size of the first side of the NV diamond material.

4. The magnetic sensor assembly of claim 1, further comprising:
   one or more optical detectors formed in a detector region in a plane on the assembly substrate, wherein a size of the RF excitation source in the plane is greater than a size of the detector region.

5. The magnetic sensor assembly of claim 4, wherein the RF excitation source is formed on a first side the NV diamond material, and a size of the RF excitation source in a plane of the first side is greater than a size of the first side of the NV diamond material.

6. A magnetic sensor assembly, comprising:
   a base substrate; and
   a diamond assembly, formed on the base substrate, and comprising:
     an assembly substrate;
     nitrogen vacancy (NV) diamond material comprising a plurality of NV centers, and formed on the assembly substrate; and
     a radio frequency (RF) excitation source formed on the NV diamond material.

7. The magnetic sensor assembly of claim 6, wherein the RF excitation source is in the form of a coil.

8. The magnetic sensor assembly of claim 6, wherein the RF excitation source comprises:
   a seed layer formed on a surface of the NV diamond material; and
   a film metallization layer formed on the seed layer.

9. The magnetic assembly of claim 6, wherein the film metallization layer is formed of copper.

10. The magnetic sensor assembly of claim 6, where the diamond assembly further comprises an RF connector connected to the excitation source, the RF connector configured to connect to a power source and a controller.

11. The magnetic sensor assembly of claim 6, wherein the base substrate comprises a printed circuit board (PCB).

12. A magnetic sensor assembly, comprising:
   a base substrate; and
   a material assembly, formed on the base substrate, and comprising:
     an assembly substrate;
     magneto-optical defect center material comprising a plurality of magneto-optical defect centers, and formed on the assembly substrate; and
     a radio frequency (RF) excitation source formed on the magneto-optical defect center material.

13. A magnetic sensor assembly, comprising:
   a base substrate; and
   a diamond assembly, formed on the base substrate, and comprising:
     an assembly substrate;
     nitrogen vacancy (NV) diamond material comprising a plurality of NV centers, and formed on the assembly substrate; and
     an electromagnetic excitation source formed on the NV diamond material or on the assembly substrate; and power/logic circuits formed on the base substrate and electrically connected to the electromagnetic excitation source to provide control of the electromagnetic excitation source.

14. The magnetic sensor assembly of claim 13, wherein the electromagnetic excitation source is an optical excitation source.

15. The magnetic sensor assembly of claim 13, wherein the base substrate comprises a printed circuit board (PCB).

16. The magnetic sensor assembly of claim 13, further comprising a power/logic connector electrically connected to the power/logic circuits and comprising a plurality of connectors configured to connect to an external power source and controller.

17. The magnetic sensor assembly of claim 13, wherein at least some of the power/logic circuits are mounted on a same top surface of the base substrate that the diamond assembly is mounted on.

18. The magnetic sensor assembly of claim 13, wherein at least some of the power/logic circuits are mounted on a bottom surface of the base substrate opposite to a surface of the base substrate that the diamond assembly is mounted on.

19. A magnetic sensor assembly, comprising:
   a base substrate; and
   a diamond assembly, formed on the base substrate, and comprising:
      an assembly substrate;
      nitrogen vacancy (NV) diamond material comprising a plurality of NV centers, and formed on the assembly substrate; and
      an optical excitation source formed on the NV diamond material.

20. The magnetic sensor assembly of claim 19, wherein the optical excitation source is one of a laser diode or a light emitting diode.

21. A magnetic sensor assembly, comprising:
   a base substrate; and
   a diamond assembly, formed on the base substrate, and comprising:
      an assembly substrate;
      nitrogen vacancy (NV) diamond material comprising a plurality of NV centers, and formed on the assembly substrate; and
      an optical detector formed on the assembly substrate.

22. The magnetic sensor assembly of claim 21, wherein the optical detector is a photodiode.

23. The magnetic sensor assembly of claim 21, wherein the base substrate comprises a printed circuit board (PCB).

24. A magnetic sensor assembly, comprising:
   a base substrate; and
   a diamond assembly, formed on the base substrate, and comprising:
      an assembly substrate;
      nitrogen vacancy (NV) diamond material comprising a plurality of NV centers, and formed on the assembly substrate;
      an optical excitation source formed on the assembly substrate; and
      an optical detector formed on the assembly substrate.

25. The magnetic sensor assembly of claim 24, wherein the optical detector is a photodiode.

26. The magnetic sensor assembly of claim 24, wherein the optical excitation source is one of a laser diode or a light emitting diode.

27. A magnetic sensor assembly, comprising:
   a base substrate; and
   a material assembly, formed on the base substrate, and comprising:
      an assembly substrate;
      magneto-optical defect center material comprising a plurality of magneto-optical defect centers, and formed on the assembly substrate;
      an optical excitation source formed on the assembly substrate; and
      an optical detector formed on the assembly substrate.

28. A magnetic sensor assembly, comprising:
   a base substrate; and
   a diamond assembly, formed on the base substrate, and comprising:
      an assembly substrate;
      nitrogen vacancy (NV) diamond material comprising a plurality of NV centers, and formed on the assembly substrate;
      a plurality of optical excitation sources formed on the assembly substrate; and
      a plurality of optical detectors formed on the assembly substrate.

29. The magnetic sensor assembly of claim 28, wherein the optical excitation sources and the optical detectors are arranged in an alternating fashion on the assembly substrate.

30. The magnetic sensor assembly of claim 29, wherein the optical excitation sources and the optical detectors are arranged in a checkerboard fashion.

31. The magnetic sensor assembly of claim 28, wherein the optical excitation sources are one of laser diodes or light emitting diodes.

32. The magnetic sensor assembly of claim 28, wherein the optical detectors are photodiodes.

33. A magnetic sensor assembly, comprising:
   a base substrate; and
   a diamond assembly, formed on the base substrate, and comprising:
      an assembly substrate;
      nitrogen vacancy (NV) diamond material comprising a plurality of NV centers, and formed on the assembly substrate; and
      a plurality of optical excitation sources formed on a top surface of the assembly substrate, wherein the assembly substrate has a plurality of connection pads on a bottom surface of the assembly substrate contacting corresponding conducting through connections extending through the assembly substrate and electrically connected to plurality of the optical excitation sources.

34. The magnetic sensor assembly of claim 33, further comprising a radio frequency (RF) excitation source formed on the NV diamond material.

35. A method of forming a magnetic sensor assembly comprising:
   forming a base substrate;
   forming an assembly substrate on base substrate;
   forming a nitrogen vacancy (NV) diamond material comprising a plurality of NV centers on the assembly substrate; and
   forming a radio frequency (RF) excitation source on the NV diamond material.

36. The method of forming a magnetic sensor assembly according to claim 35, wherein the forming a RF excitation source forms the RF excitation source in the form of a coil.

37. The method of forming a magnetic sensor assembly according to claim 35, wherein the forming a RF excitation source comprises:

forming a seed layer on a surface of the NV diamond material;

depositing a film metallization layer formed on the seed layer; and patterning the seed layer and the film metallization layer to form the RF excitation source in a spiral shape.

38. The method of forming a magnetic sensor assembly according to claim 37, wherein the film metallization layer is formed of copper.

39. A method of forming a magnetic sensor assembly comprising:

forming a base substrate;

forming an assembly substrate on base substrate;

forming a plurality of optical excitation sources on the assembly substrate; and forming a nitrogen vacancy (NV) diamond material comprising a plurality of NV centers on the assembly substrate.

40. A magnetic sensor assembly, comprising:

a base substrate; and a material assembly, formed on the base substrate, and comprising:

an assembly substrate;

magneto-optical defect center material comprising a plurality of magneto-optical defect centers, and formed on the assembly substrate; and a radio frequency (RF) means, for providing an RF field, formed on the magneto-optical defect center material.

41. A magnetic sensor assembly, comprising:

a base substrate; and a material assembly, formed on the base substrate, and comprising:

an assembly substrate;

magneto-optical defect center material comprising a plurality of magneto-optical defect centers, and formed on the assembly substrate;

an optical excitation means, for providing optical excitation, formed on the assembly substrate; and a detector means, for detecting optical radiation, formed on the assembly substrate.

42. A magnetic sensor assembly, comprising:

a base substrate; and a diamond assembly, formed on the base substrate, and comprising:

an assembly substrate;

magneto-optical defect center material comprising a plurality of magneto-optical defect centers, and formed on the assembly substrate; and an optical excitation source formed on the magneto-optical defect center material.

43. A magnetic sensor assembly, comprising:

a base substrate; and a diamond assembly, formed on the base substrate, and comprising:

an assembly substrate;

magneto-optical defect center material comprising a plurality of magneto-optical defect centers, and formed on the assembly substrate; and an optical detector formed on the assembly substrate.

44. A method of forming a magnetic sensor assembly comprising:

forming a base substrate;

forming an assembly substrate on base substrate;

forming a magneto-optical defect center material comprising a plurality of magneto-optical defect centers on the assembly substrate; and forming a radio frequency (RF) excitation source on the magneto-optical defect center material.

* * * * *